United States Patent [19]

VanMeter

[11] 4,210,776
[45] Jul. 1, 1980

[54] LINEAR DIGITAL PHASE LOCK LOOP

[75] Inventor: Kenneth R. VanMeter, Phoenix, Ariz.

[73] Assignee: Harris Corporation, Cleveland, Ohio

[21] Appl. No.: 823,645

[22] Filed: Aug. 11, 1977

[51] Int. Cl.² .............................................. H03K 1/00
[52] U.S. Cl. .................................. 375/120; 331/1 A; 328/63
[58] Field of Search ................... 178/69.1; 179/15 BS; 328/72, 63, 155; 331/10, 17, 1 A, 25, 18

[56] References Cited

U.S. PATENT DOCUMENTS

| 3,564,425 | 2/1971 | Brok ....................................... 328/72 |
| 3,646,452 | 2/1972 | Horowitz et al. ...................... 328/63 |
| 3,889,186 | 6/1975 | Larson ................................. 328/155 |

*Primary Examiner*—Robert L. Griffin
*Assistant Examiner*—Peter Durigon

[57] ABSTRACT

A linear digital phase locked-loop generates a recovered clock which is synchronized with level transitions in the data signal being tracted. Internally generated clock pulses are cyclically counted to generate a binary ramp signal. This ramp signal is added to another digital signal whose value depends upon the phase and frequency departure of the data signal from the recovered clock. A first order linear accumulator supplies a modified summation signal upon transistions in the data signal and the recovered clock is adjusted to fall in sync with the data. A second order loop may be selectively employed for phase and frequency tracking. The second order loop includes a further linear accumulator which supplies a digital signal to be combined with the binary ramp signal to adjust the recovered clock frequency until the first and second order loops are stablished, at which time the clock is synchronized with the data. As the first and second order loops stabilize, the composite behavior is linear and may be described by classical second order servo-control loop equations. This allows for linear analysis of systems using this bit synchronizer as a system component.

18 Claims, 6 Drawing Figures

(IN SYNC)

(PHASE SHIFT)

(FREQUENCY SHIFT)

PHASE ERROR $\theta_e(t)$ DUE TO A STEP IN PHASE $\Delta\theta$.

TRANSIENT PHASE ERROR $\theta_e(t)$
DUE TO A STEP IN FREQUENCY $\Delta\omega$

4,210,776

LINEAR DIGITAL PHASE LOCK LOOP

FIELD OF THE INVENTION

The present invention relates to a phase lock-loop, especially one having a totally digital implementation, which is capable of synchronizing an internally generated clock with both the phase and the frequency of an incoming digital data signal.

DESCRIPTION OF THE PRIOR ART

Conventional techniques of recovering data from an incoming signal have included simple level detection, the use of pulse-delay circuits (one-shots), special phase lock designs and phase lock-loop chips, and high performance modern-type bit synchronizers. Unfortunately, each of these approaches to data recovery usually provides only marginal performance, requires a considerable amount of special design, or is an over-kill. Moreover, these techniques may involve the use of analog components which contribute to drift or require external adjustments.

SUMMARY OF THE INVENTION

In overcoming these drawbacks of the prior art, the present invention provides a totally digital implementation of a two-order linear phase lock-loop, which provides a recovered clock synchronized in phase and frequency with an incoming digital data stream. Problems such as drift, inherent in an analog or hybrid VCO phase lock-loop, are eliminated.

Briefly, the two-order phase lock-loop of the present invention includes a stable fixed reference oscillator which generates a square-wave at thirty-two times the data bit rate. A five bit binary counter generates a five bit parallel ramp signal which is continuously phase shift-controlled through the use of a first five bit adder. Adding a "one" to the reference ramp signal shifts the phase of the generated clock by one thirty-second of the bit period by causing the adder to overflow one thirty-second of a bit early. By controlling the rate of change of the control count supplied to this five bit adder, the generated clock frequency may be frequently adjusted to track limited variations in the input data frequency. This changing control count is generated by a second order accumulator which will be described later.

The output of this first adder may be phase-shifted by a second five bit adder which receives a phase error control count. The phase-shifted ramp signal is coded by an offset binary coverter to effect a two's complement version of the output of the second adder. This two's complement signal is supplied to a first order loop integrator, incorporating a linear accumulator composed of a twelve bit adder and an associated twelve bit register. The two's complement output of the second adder is sampled at the times of input data transitions to provide a direct measurement of phase error and the register is updated to reflect this error. The contents of the register are scaled by a prescribed factor and are combined with the output of the first five bit adder in the second five bit adder to provide an instantaneous phase adjustment. The most significant bit output of the second five bit adder represents the recovered clock.

Another linear accumulator, also composed of a twelve bit adder and an associated twelve bit register, receives the scaled output of the first order linear accumulator as part of a second order operation for frequency tracking. This accumulator is updated continuously instead of only during a data transition sample creating a ramp signal whose frequency is proportional to the scaled output of the first accumulator. The output of this second order linear accumulator is scaled and added to the output of the five bit binary counter in the first five bit adder to continuously phase shift the output causing the frequency control function briefly mentioned in the first paragraph. As the phase and/or frequency of the incoming data stream shift, the contents of the accumulators are adjusted to track the changes, so that the recovered clock is synchronized with the incoming data stream.

DETAILED DESCRIPTION

Figure 1:
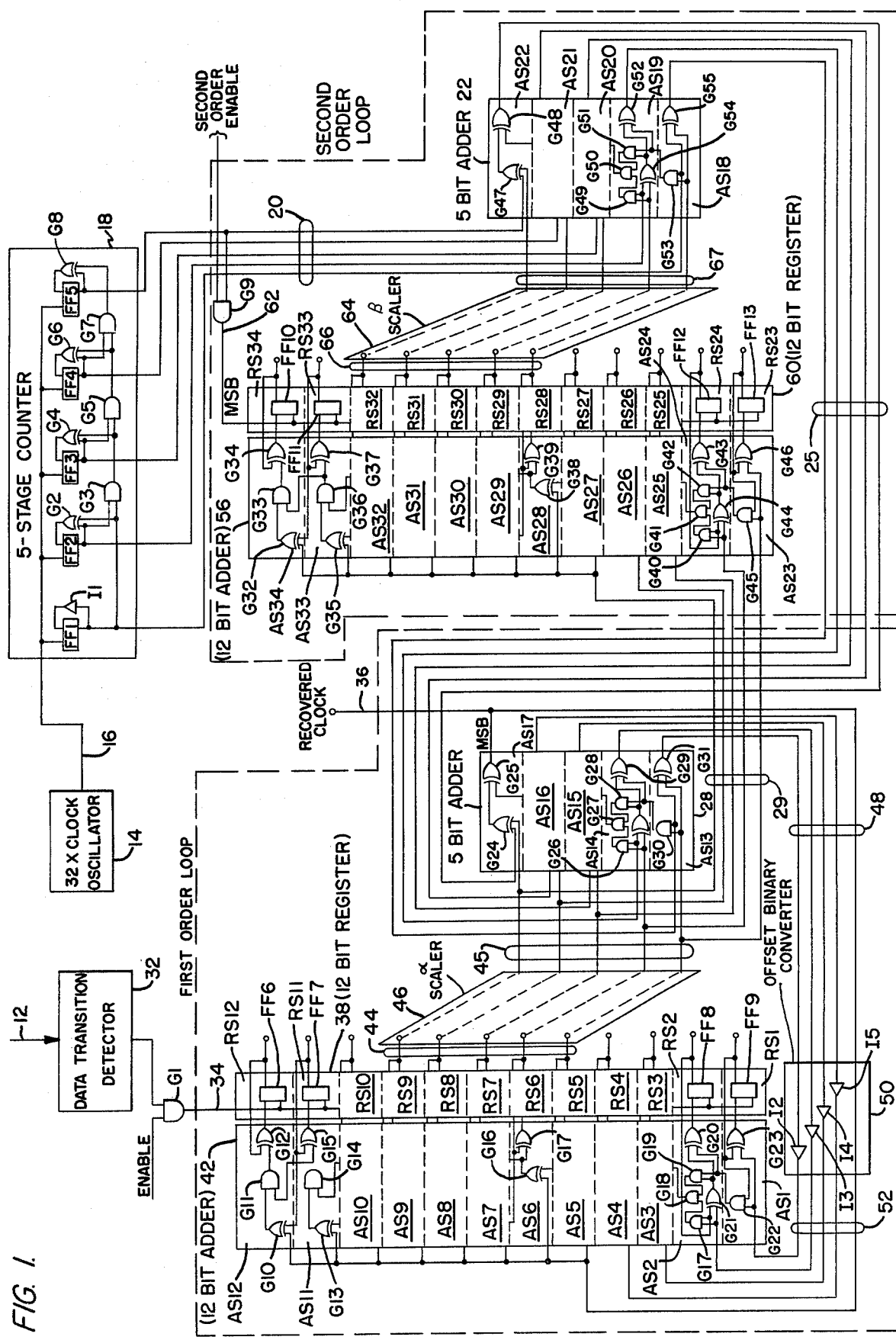
FIG. 1 is a detailed logic diagram of the two-order digital linear phase lock-loop of the present invention.

Referring now to FIG. 1, a raw digital data stream, the phase and frequency of which are to be tracked, is supplied by way of input line 12 to a data transition detector 32 which generates an output pulse through gate G1 on line 32 at the times of data transistions between the high and low, or "1" and "0," levels of the input data stream.

FIG. 2(a) illustrates the raw digital data stream on line 12 while 2(b) illustrates the data transition output signal on line 34. The object of the system shown in FIG. 1 is to align the time of occurrence of the recovered clock at output terminal 36 with the data transition pulses on line 34.

The source of the recovered clock is an oscillator 14 which generates a square-wave having a frequency which is a binary multiple of the bit rate of the raw data. In the exemplary embodiment herein described, the square-wave is thirty-two times the bit rate to provide five binary bits for the parametic operating range of the system. However, the scope of the invention is not limited to the use of five bits, but this parameter may be appropriately varied to meet design and response criteria. This square-wave is supplied on line 16 to a five stage binary counter 18. Counter 18 consists of five flip-flops FF1-FF5, the outputs of which are serially divided through inverter I1 and gates G2-G8 to provide a five bit binary representation of the number of square-wave pulses supplied by oscillator 14. It should be noted that for purposes of simplifying the drawing, the D.C. reset connections for each of the flip-flops shown in FIG. 1 have been omitted.

Once the system has been reset and assuming that the clock signal is in sync with the incoming data stream, the decimal total of the contents of counter 18, as a ramp signal, which is reset every thirty-two pulses, will be shifted in phase by half a period from the data transition times, as shown in FIG. 2(c). The reason for this shift will be explained later in connection with the operation of the adder and accumulator circuitry.

The $2^0$ through $2^4$ outputs of the five stages of counter 18 are coupled over five bit lines 20 to five respective inputs of a five bit adder 22. The adder 22 is composed of five adder stages AS18–AS22. Adder stage AS18 consists of gates G53 and G55, while adder stage AS19 consists of gates G49–G52 and G54. The configuration of each of adder stages AS20 and AS21 is identical to that of adder stage AS19 and an illustration of these individual circuits has been omitted for clarity. The most significant bit adder stage AS22 consists of a pair of gates G47 and G48. The other five inputs to adder 22 are derived by way of a β scaler 64 from selected stages of a twelve bit register 60.

Register 60 is comprised of twelve register stages RS23–RS34, each stage consisting of a latching flip-flop coupled to receive the respective outputs of twelve bit adder 56. In FIG. 1, only flip-flops FF10–FF13 of register stages RS34, RS22, RS24, and RS33 are illustrated for clarity. The output of each register stage is fed back through a respective adder stage of adder 56 to register 60, so that register 60 will maintain an accumulation of the summation output of adder 56 and thereby function as a linear accumulator. The contents of each register stage RS23–RS34 are gated out by way of the most significant bit (MSB) of counter 18 over line 62 through a gate G9, provided that the second order loop is enabled. Normally, the second order loop will be enabled; however, if variations in frequency of the incoming data stream are not expected, the incoming data signal can be rapidly tracked by using the first order loop exclusively. For this purpose, the linear accumulator within the second order loop is prevented from updating itself, by disabling gate G9, so that the second order loop cannot modify the ramp counter signal supplied from counter 18 to the five bit adder 22. Disabling the second order loop makes the adder 22 transparent to the ramp output of counter 18 and the lock-up time required for the recovered clock derived at terminal 36 to synchronize itself with the data transitions will depend only upon the behaviour of the first order loop.

For the specific configurations shown in FIG. 1, the factor provided by the β scaler 64, connected to selective output lines 66 of the register 60, is 1/32. Normally, after the system has been reset and assuming that the recovered clock is synchronized with the incoming data signal, the binary signal level on each of the lines 67 will be a "0," so that the signal level on each of lines 25 from adder 22 will be identical to that on lines 20 from counter 18.

Output lines 25 from the five stages of adder 22 are connected to respective parallel inputs of another five bit adder 28, the internal circuitry of which is identical to that of adder 22. The other inputs, lines 45, of adder 28 are coupled through an α scaler 46 to selected lines 44 of twelve bit register 38. In the exemplary embodiment shown in FIG. 1, wherein the fifth through ninth stages of register 60 are connected to the input lines 45 of adder 28, the α scaler provides a scaling factor of 1/16.

The five selected outputs 44 of the register 38 are also connected, by way of lines 29, to the five least significant bit adder stages AS23–AS27 of adder 56 within the second order loop. The fifth bit supplied to adder stage AS27 is also connected in common to the inputs of each of adder stages AS28–AS34 in order to "top-end load" the accumulator whenever the most significant bit of lines 29 is a "1."

The twelve stages AS23–AS34 of adder 56 are composed of appropriate gate interconnections as shown. Gates G40–G46 are connected to form the two adder stages AS23 and AS24 for the two least significant bits, in a manner corresponding to the gate connections of adder stages AS18 and AS19 of five bit adder 22, described previously. Adder stages AS25–AS27 are internally identical to adder stage AS24. Adder stage AS28 is composed of gates G38 and G39, while each of adder stages AS29–AS34 is composed of the same gate interconnections, those for stages AS33 and AS34 being illustrated as made of gates G32–G37.

The five parallel output lines 48 from adder 28 are coupled to the adder stages AS1–AS5 of adder 42 through the output lines 52 of an offset binary converter 50 which provides a two's complement of the four least significant bits from stages AS13–AS16 of adder 28. Offset binary converter is formed of four inverters I2–I5 and a noninverted connection. The input line to adder stage AS5 is also connected in common to the inputs of adder stages AS6–AS11 in the same manner as described above with respect to the inputs of adder 56 in the second order loop. Register 38 is coupled to adder 42, so that each latch flip-flop will be connected to a respective adder stage to effect the accumulation of the summation output of the adder 42 in the same manner described in connection with the output of the linear accumulator in the second order loop comprised of register 60 and adder 56. The contents of the register 38 are gated out whenever there is a transition in the input data stream, causing a gate signal to be supplied over line 34 to each of the latch flip-flops of register 38.

The operation of the system will now be explained.

PHASE TRACKING (SECOND ORDER LOOP ENABLED) IN SYNC

To facilitate an understanding of the operation of the system, let it initially be assumed that the system has been reset and that the recovered clock at terminal 36 is synchronized with the frequency and phase of the raw input data. Under these conditions, the contents of each of register 38 and 60 are all "0"s. As counter 18 counts the square-wave pulses produced by oscillator 14, five bit adder 22 adds the five "0" outputs of the sixth through tenth stages of register 60 (as supplied by the β scaler 64) to the contents of counter 18 supplied over lines 20. Since only "0"s are supplied from the β scaler 64 on lines 67, adder 22 is effectively transparent to the ramp output of the counter 18 shown in FIG. 2(c), so that the ramp signal on lines 20 is coupled via lines 25 to the five parallel inputs to adder 28. Again, since each stage of register 38 has been cleared, the state of each of lines 45 will be "0" so that the five bit adder 28 adds the number "00000" to the ramp output of counter 18, whereby the output of adder 28 follows the ramp, as shown in FIG. 2(d).

Now, during the process of counting the pulses supplied from oscillator 14, eventually the most significant bit (the $2^4$ bit) of each of adder 28, adder 22, and counter 18, changes from a "0" to a "1" when the counter 18 counts the sixteenth pulse from oscillator 14. The contents of counter 18, immediately prior to this time, are "01111." This five bit number appears on lines 48 (since adders 22 and 28 are effectively transparent to the output of counter 18) and the four least significant bits are changed to "0"s by the inverters I2–I5 of binary offset converter 50. As a result, the output of binary converter 50 is the five bit number "00000," which is added to the cleared contents of the twelve bit register 38, so that the contents of the linear accumulator in the first order loop are not increased, but remain the twelve bit number "000000000000." When the contents of the twelve bit register 38 are gated out at the data transition, the α scaler 46 supplies the five bit number "00000" to be added to the five bit number on lines 25 from adder 22. At this time, at the occurrence of the sixteenth pulse from the oscillator 14, the MSB of adder 28 changes to a "1," so that the state of line 36 changes from a "0" to a "1;" namely, the occurrence of a transition on the recovered clock line 36 from the level "0" to the level "1" coincides with a data transition on line 34, whereby the recovered clock is synchronized with the data transitions. When the counter 18 recycles through a count of 31 (11111) back to ("00000") the MSB goes back to "0" so that the recovered clock line 36 changes from a "1" to a "0." The synchronized recovered clock signal is shown in FIG. 2(e).

PHASE SHIFT

Let it now be assumed that the raw input data stream changes phase so as to lead the recovered clock. As an example, let it be assumed that the data transition occurs when the output of counter 18 is (00101). Since the previously gated-out contents of registers 38 and 60 were all "0"s, the five bits (00101) are coupled through adders 22 and 28 to binary offset converter 50. Converter 50 changes the number (00101) on input lines 48 to the number (01010) on its output lines 52. With the most significant bit of lines 52 being strapped to an input of each of adder stages AS5-AS12, then, at the next data transition, the number (000000001010) will be added to the contents of register 38 which are all zeros, so that register 38 now contains the number 000 000 001 010.

Upon each subsequent data transition, the contents of register 38 will be incremented in a similar fashion and, eventually, the contents will be such that α scaler 46 will no longer simply supply zeros to the five bit adder 28, but will begin to supply a number other than 00000 (such as 00001, initially) which, when added to the five bit number supplied over lines 25 from adder 22, will cause the five bits supplied on output lines 48 to be different from the five bits on input lines 25. A new number will now be supplied from offset binary converter 50 to the inputs of adder 42 to be added to the contents of the register 38 at each data transition.

As the contents of the register 38 continue to increase due to this incrementing process, the occurrence of the transitions in the recovered clock derived from line 36 will continue to close in on the occurrence of the data transitions supplied on lines 34. Namely, as the number represented by the five bits supplied from the α scaler 46 continues to increase, the total of this number and the number supplied over lines 25 will get closer and closer to the number 15, so, eventually, upon some data transition, the MSB of adder 28 will change from a "0" to a "1" in synchronization with the data transition on line 34.

During the above incrementing process within the first order loop, the linear accumulator within the second order loop is also incremented as lines 45 from the α scaler 46, connected to the adder 56, continue to supply a number other than "00000." Eventually, by virtue of the incrementing process carried out in the second order accumulator, the number represented on lines 67 from the β scaler 64 begins to take on a value other than "00000", as was the case with the α scaler 46 during the incrementing of the contents of the register 38. This means that the five bit adder 22 is no longer transparent to the ramp output of counter 18 and the five bit number supplied by lines 25 is now larger than it was at the initial occurrence of the phase shift. As five bit adder 28 within the first order loop continues to add together the contents of lines 25 and 45, as was pointed out above, the MSB line of adder 28 eventually changes from a "0" to a "1" at a time which no longer leads the time of occurrence of a data transition, since the five bit numbers on each of lines 25 and 45 have continued to increase. For normal operation of the system, depending upon the choice for the scaling constants α and β scalers 46 and 64, respectively, the recovered clock will now lag the raw data transitions. When this occurs, the MSB output of five bit adder 28 supplies a "1" through the noninverted MSB line of converter 52 to each of adder stages AS5-AS12 in twelve bit adder 42. When a "1" now added to the contents of the fifth stage of the register 38, (due to the operation of the adder 42) the contents of each of stages RS5-RS12 will change to "1." Namely, once the recovered clock begins to lag the data transitions, the linear accumulator begins a decrementing process. A similar operation takes place in the linear accumulator within the second order loop.

Figure 5:
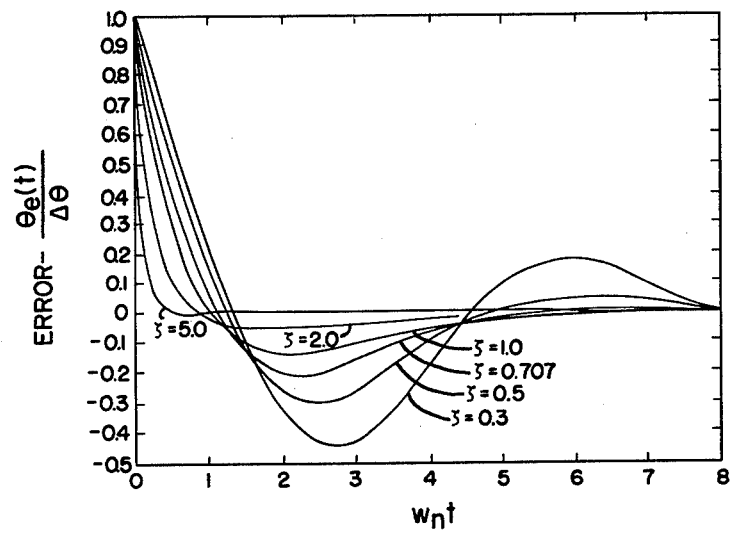

FIG. 5 shows the response characteristic of a second order phase lock-loop, wherein variations in phase error $\theta_e(t)$ are plotted relative to step changes in phase $\Delta\theta$. The curves identified by the symbol $\xi$ represent the tracking response corresponding to the total count in each of adders 28 and 22 within the first and second order loops, respectively, for variations in the scaling constants α and β, where $\xi = \frac{1}{2}\sqrt{\alpha/\beta}$.

For the exemplary choice of scaling constants illustrated in FIG. 1, $\xi = 0.707$. As is shown in FIG. 5, the initially advanced phase of the recovered clock relative to the occurrence of the data transitions decreases and over-shoots the conditions wherein the phase error would be zero, so that the phase of the recovered clock then begins to lag the raw data. After a short period of time, the magnitude of the phase difference between the lagging recovered clock and the raw data begins to decrease and once more approach in-sync conditions. Namely, there is an oscillatory action as the contents of the linear accumulators within each of the first and second order loops are incremented and the decremented. Eventually, as a result of these incrementing and decrementing operations, the contents of the register 38 will be such that upon readout, at a data transition, α scaler 46 will supply only "0"s to the five bit adder when the inputs on lines 25 from the adder 22 are (01111). At this time, since the state of each of lines 29 is a "0," the linear accumulator within the second order loop is no longer incremented or decremented, so that β scaler 64 continues to supply the same five bit number on lines 67 to be added to the ramp supplied over lines 20 of the five bit adder 22. The recovered clock on the MSB line 36 is now in-sync with the incoming data stream.

Figure 2:
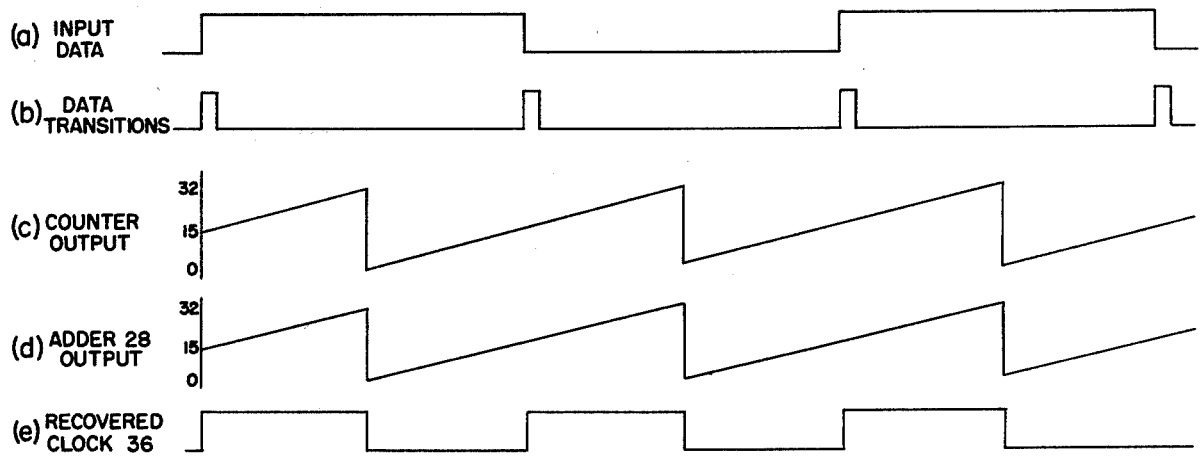
FIGS. 2 through 4 are timing diagrams useful for illustrating the operation of the circuitry shown in FIG. 1 and FIGS. 5 and 6 are diagrams illustrating the response of the phase lock-loop for step changes in phase and frequency, respectively.
Figure 3:
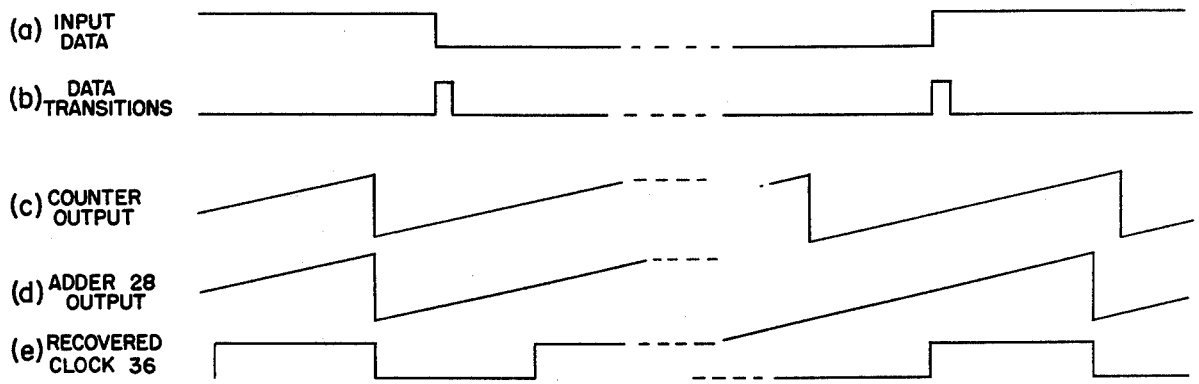
Figure 4:
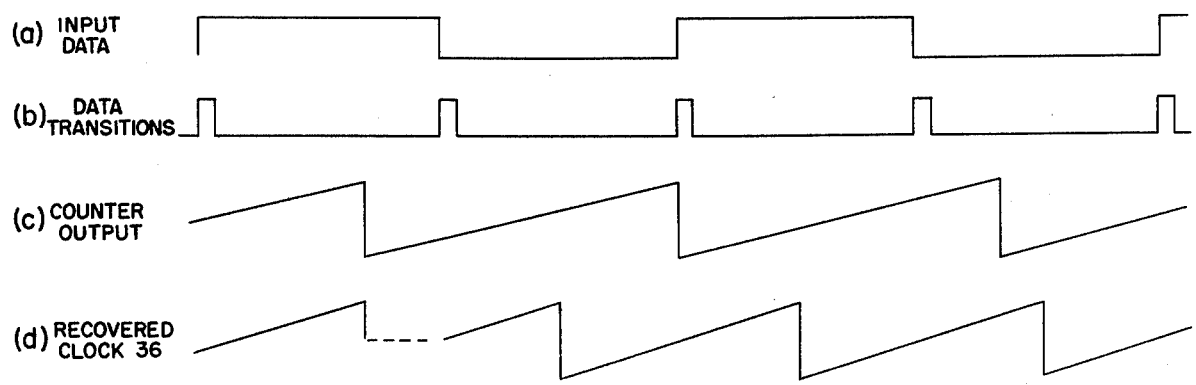

FIGS. 3(a) through 3(e) show the changes in the waveforms illustrated in FIG. 2 for the above-described phase change, wherein the initial shift is such that the raw data leads the recovered clock. As can be seen in the right hand portion of FIG. 3(c), the ramp signal supplied to the five bit adder 22 from the counter 18 lags the output of adder 22 by a constant duration corresponding to the five bit number supplied by the β scaler 64 from the second order loop accumulator.

Although, in the above example, the operation of the system was described for an initial change in phase of the raw data wherein the raw data leads the recovered clock, a similar operation takes place where the raw data changes phase so as to lag the recovered clock. Upon this occurrence, registers 38 and 60 of the linear accumulators in the first and second order loops, respectively, will initially be decremented, to force the recovered clock to shift in a direction so that the data transitions will lad the recovered clock and then again change in a lagging direction, namely in an oscillatory manner, as discussed above, in connection with the phase response characteristics illustrated in FIG. 5.

PHASE TRACKING (SECOND ORDER LOOP DISABLED)

Where changes in frequency of the incoming data steam are not expected and a rapid phase tracking capability of the system is desired, gate G9 can be disabled so that the linear accumulator within the second order loop is prevented from supplying anything but "0"s to the five bit adder 22. This procedure makes third adder 22 transparent to the output of counter 18, so that the states of each line 25 supplied to the inputs of five bit adder 28 precisely follow the ramp output of the counter 18. The linear accumulator within the first order loop will be either incremented or decremented, rather than oscillate, until the contents of the appropriate registers in register 38 are such that the state of lines 45 from the $\alpha$ scaler 46, when added to the five bit number supplied by lines 25, totals fifteen at the occurrence of a data transition. Just as occurred with the dual operation of both the first and second order loops, the linear accumulator is no longer incremented so that the same constant number is continually supplied by $\alpha$ scaler 46 to the five bit adder at the occurrence of a data transition, so that the contents of the five bit adder 28 always total fifteen at that time.

FREQUENCY TRACKING

As was pointed out previously, by virtue of the second order behaviour of the system, the system is capable of tracking limited variations in frequency of the incoming data stream.

The operation of the system is exactly the same as discussed previously in connection with the use of the second order loop for tracking variations in phase. However, since a change in frequency of the raw data is, in effect, a continual change in phase of the raw data relative to the recovered clock, the action of the first and second order loops is such that $\alpha$ scaler 46 within the first order loop will eventually continuously supply a constant number, incrementing the contents of the linear accumulator in the second order loop so that $\beta$ scaler 64 supplies its own ramp signal to be added to the ramp output of the counter 18. These two ramp signals are added in the five bit adder 22 so that the rate at which the states of lines 25 progress from zero to thirty-one and recycle is adjusted until that rate matches the rate of the raw input data signal.

Figure 6:
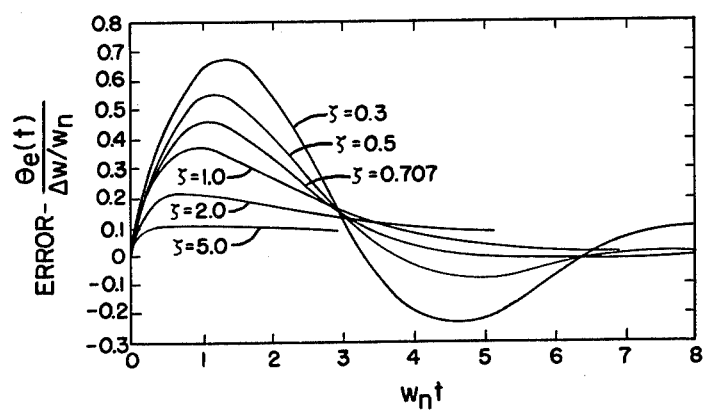

FIG. 6 shows a plurality of curves representing the transient phase error $\theta_e(t)$ due to a step change in frequency $\Delta\omega$, for the two-order loop system. In a fashion similar to the response characteristics shown in FIG. 5, there is an initial oscillation of the first and second order loops until the frequency of the recovered clock is appropriately adjusted to track that of the incoming data signal.

FIGS. 4(a) through 4(d) show waveforms for the raw data, data transitions, counter 18 output and recovered clock 36 for a step change frequency of the incoming data stream to a frequency higher than that of the recovered clock. The data transitions initially occur more rapidly than the recovered clock and they always occur more rapidly than the output of the oscillator 14. However, by virtue of the additional ramp signal provided by the operation of the first and second order loops, the frequency of the recovered clock is adjusted to match that of the incoming data signal.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

It should be noted that the $\alpha$ and $\beta$ scale factors completely control the damping factor and bandwidth independently of frequency. The operating frequency to which all parameters are scaled is completely controled by a fixed reference oscillator. There are no other adjustments involved.

I claim:

1. A linear digital phase locked loop for generating a recovered clock signal, level transitions in which are synchronized with level transitions in an input data signal comprising:
   first means for generating a periodic pulse signal having a repetition rate which is a multiple of the frequency of said input data signal;
   second means, coupled to said first means, for generating a first signal related to the number of pulses as they are generated by said first means up to a prescribed number and then repeatedly generating further first signals as subsequent pulses are generated by said first means;
   third means, coupled to said second means, for combining said first signal with a second signal representative of a number dependent upon the occurrence of a level transition in said input data signal, and producing said recovered clock signal having prescribed level transitions which occur at times when the combination of said first and second signals reaches a value corresponding to a preselected number.

2. A linear digital phase locked loop according to claim 1, wherein said second means comprises:
   a counter circuit, coupled to said first means, for repeatedly counting pulses contained within said periodic pulse signal up through a prescribed count and then recycling,
   a first adder circuit coupled to receive the output pulse count of said counter circuit and producing a first summation output coupled to said third means, and
   a first accumulator-scaler circuit, coupled to said third means, for generating a third signal in dependence upon the output of said first adder circuit and the occurrence of level transitions in said input data signal and supplying said third signal to said first adder circuit.

3. A linear digital phase locked loop according to claim 1, wherein said third means comprises:
   an adder circuit coupled to receive the first signal output of said second means,
   a converter circuit, coupled to the output of said adder circuit, for converting the output of said adder circuit into a modified summation signal, and an accumulator-scaler circuit, coupled to said converter circuit, for generating said second signal, and supplying said second signal to said adder circuit to be added to said first signal by said adder circuit.

4. A linear phase locked loop according to claim 2, wherein said third means comprises:
a second adder circuit coupled to receive the first signal output of said second means,
a converter circuit, coupled to the output of said second adder circuit, for converting the output of said second adder circuit into a modified summation signal, and
a second accumulator-scaler circuit, coupled to said converter circuit, for generating said second signal, and supplying said second signal to said second adder circuit to be added to said first signal by said second adder circuit.

5. A linear digital phase locked loop according to claim 4, wherein said counter circuit comprises an m-stage binary counter, and said first adder circuit comprises a first m-bit adder having m-pairs of parallel inputs coupled to said counter circuit and said first accumulator-scaler circuit, respectively, and m-binary outputs.

6. A linear digital phase locked loop according to claim 5, wherein said second adder circuit comprises a second m-bit adder having m-pairs of parallel inputs coupled to the m-binary outputs of said first m-bit adder and said second accumulator-scaler circuit, respectively, and m-binary outputs.

7. A linear digital phase locked loop according to claim 6, each of the accumulator-scaler circuits comprises an n-stage adder circuit and an n-stage register circuit, wherein n>m, coupled to the n-stages of its associated adder circuit, and means for selectively coupling m outputs of the register circuit to respective ones of the m pairs of inputs of a respective one of said first and second adder circuits.

8. A linear digital phase locked loop according to claim 7, wherein the most significant bit of the m output bits of said second adder circuit is connected in common to the most significant n−m+1 stages of the n-stage adder circuit of said second accumulator-scaler circuit, and the most significant bit of the selectively coupled m outputs of the register circuit of said second accumulator-scaler circuit is connected in common to the most significant n−m+1 stages of the n-stage adder circuit of said first accumulator-scaler circuit.

9. A linear digital phase locked loop according to claim 8, including means for gating the n outputs of the n-stage adder of said second accumulator-scaler circuit into the n-stages of its associated n-stage register only upon the occurrence of level transitions in said input data signal.

10. A linear digital phase locked loop according to claim 9, including means for gating the n-outputs of the n-stage adder of said first accumulator-scaler circuit into the n-stages of its associated n-stage register in accordance with the state of the most significant bit output of said m-stage counter circuit.

11. A linear digital phase locked loop according to claim 10, wherein said converter circuit comprises means for inverting the outputs of the m−1 least significant bit outputs of said second adder circuit.

12. A linear digital phase locked loop for generating a recovered clock signal, level transitions in which are synchronized with level transitions in an input data signal comprising:
first means for repeatedly generating a digital code, the value of which changes at a frequency which is a multiple of the frequency of said input data signal; and
second means, coupled to said first means, for producing said recovered clock having prescribed level transitions which occur at times when the value of said digital code reaches the same preselected number.

13. A digital phase locked loop for generating a recovered clock signal level, transitions in which are synchronized with level transitions in an input data signal comprising:
first means for periodically generating a first digital code defined by a fixed plurality of bits the value of which changes at a frequency which is a multiple of the frequency of said input data signal;
second means, coupled to said first means, for generating a second digital code defined by said fixed plurality of bits, the value of which is related to the time of occurrence of level transitions in said input data signal; and
third means, coupled to said first and second means, for combining said first and second digital codes and producing a recovered clock signal having prescribed level transitions which occur at times when the combination of said first and second digital codes reaches a preselected value.

14. A linear digital phase locked loop according to claim 13, wherein said first means comprises means, coupled to said second means, for selectively controlling the changing values of said first digital code in dependence upon the value of said second digital code.

15. A linear digital phase locked loop according to claim 14, wherein said second means comprises means, coupled to said third means, for selectively controlling the value of said second digital code in dependence upon the value of the combination of said first and second digital code.

16. A linear digital phase locked loop according to claim 13, wherein said first means comprises:
means for continually generating a base digital code, the value of which changes at said multiple frequency, in a linear fashion from a first prescribed number up to a second prescribed number and then recycles, and
means for combining said base digital code with a first scaling digital code, the value of which depends upon the phase and frequency of said input data signal relative to said recovered clock signal, to produce said first digital code.

17. A linear digital phase locked loop according to claim 16, wherein said second means comprises means, responsive to said first digital code, for producing a third digital signal, the value of which depends upon the value of said first digital code at the time of occurrence of signal level transitions in said input data signal, and
means for selectively converting said third digital code into said second digital code.

18. A linear digital phase locked loop according to claim 17, wherein said third means comprises means for selectively adding said second digital code to said first digital code to produce said recovered clock.

* * * * *